(12) United States Patent
Muller

(10) Patent No.: US 6,909,530 B2
(45) Date of Patent: *Jun. 21, 2005

(54) MOVABLE MICROSTRUCTURE WITH CONTACTLESS STOPS

(75) Inventor: Lilac Muller, Boulder, CO (US)

(73) Assignee: PTS Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/871,466

(22) Filed: Jun. 18, 2004

(65) Prior Publication Data

US 2004/0240021 A1 Dec. 2, 2004

Related U.S. Application Data

(60) Continuation of application No. 10/705,390, filed on Nov. 10, 2003, now Pat. No. 6,778,304, which is a division of application No. 09/899,004, filed on Jul. 3, 2001, now Pat. No. 6,657,759.

(51) Int. Cl.⁷ .............................................. G02B 26/08
(52) U.S. Cl. ...................... 359/198; 359/199; 359/900; 310/309
(58) Field of Search ................................ 359/198, 199, 359/290, 291, 293, 297, 298, 871, 872, 892, 896, 900, 227, 230; 310/309

(56) References Cited

U.S. PATENT DOCUMENTS

| | | | |
|---|---|---|---|
| 3,896,338 A | * | 7/1975 | Nathanson et al. ......... 315/373 |
| 5,414,540 A | | 5/1995 | Patel et al. |
| 5,917,625 A | | 6/1999 | Ogusu et al. |
| 5,960,133 A | | 9/1999 | Tomlinson |
| 5,999,672 A | | 12/1999 | Hunter et al. |
| 6,028,689 A | | 2/2000 | Michalicek et al. |
| 6,040,935 A | | 3/2000 | Michalicek |
| 6,097,519 A | | 8/2000 | Ford |
| 6,097,859 A | | 8/2000 | Solgaard |
| 6,108,471 A | | 8/2000 | Zhang et al. |
| 6,128,122 A | | 10/2000 | Drake et al. |
| 6,307,657 B1 | | 10/2001 | Ford |
| 6,501,877 B1 | | 12/2002 | Weverka et al. |
| 6,583,921 B2 | * | 6/2003 | Nelson ....................... 359/291 |
| 6,657,759 B2 | * | 12/2003 | Muller ....................... 359/198 |
| 6,778,304 B1 | * | 8/2004 | Muller ....................... 359/199 |

OTHER PUBLICATIONS

T. Akiyama, et al.; "Controlled Stepwise Motion in Polysilicon Microstructures," Journal of Microelectromechanical Systems, vol. 2, No. 3, Sep. 1993; pp. 106–110.

C.M.A. Ashruf, et al., "Galvanic porous silicon formation without external contacts," Sensors and Actuators 74 (1999) pp. 118–122.

Kenneth Bean, et al., "Anisotropic Etching of Silicon," IEEE Transactions on Electron Devices, vol. Ed-25, No. 10, Oct. 1978.

(Continued)

*Primary Examiner*—James Phan
(74) *Attorney, Agent, or Firm*—Townsend and Townsend and Crew LLP

(57) ABSTRACT

A movable microstructure is provided that mitigates stiction. A substrate is provided on which a structural linkage is connected to support a structural film. A hold electrode is connected with the substrate at a position laterally beyond an orthogonal projection of the structural film on the substrate. It is configured to hold the structural film electrostatically in a tilted position with respect to the substrate upon application of a potential difference between the structural film and the hold electrode. Because of its positioning with respect to the structural film, it is ensured that the structural film is not in contact with the substrate when the structural film is being held by the hold electrode.

27 Claims, 11 Drawing Sheets

OTHER PUBLICATIONS

Dino R. Ciarlo, "A latching accelerometer fabricated by the anisotropic etching of (110) oriented silicon wafers," Lawrence Livermore Nat'l Laboratory, Mar. 1, 1992.

A.S. Dewa, et al., "Development of a Silicon Two–Axis Micromirror for an Optical Cross–Connect," Solid State Sensors and Actuators Workshop, Hilton Head, South Carolina, pp. 93–96.

Joseph Ford et al., "Wavelength Add Drop Switching Using Tilting Micromirrors," Journal of Lightwave Technology, vol. 17, No. 5, May 1999.

J. Grade et al., A Large–Deflection Electrostatic Actuator for Optical Switching Applications, Solid–State Sensor and Actuator Workshop, Hilton Head Island, South Carolina, Jun. 4–8, 2000; pp. 97–100.

V. Kaajakari et al.; "Ultrasonic Actuation for MEMS Dormancy–Related Stiction Reduction," In MEMS Reliability for Critical Applications, Proceedings of SAPIE vol. 4180 (2000); pp. 60–65.

T.L. Koch et al., "Anisotropically etched deep gratings for InP/InGaAsP optical devices," J.App. Phys. 62 (8), Oct. 15, 1987.

I. Nishi et al., "Broad–Passband–Width Optical Filter for Multi–Demultiplexer Using a Diffraction Grating and a Retroreflector Prism," Electronics Letters, vol. 21, No. 10, $9^{th}$ May 1985.

P. Phillippe et al., "Wavelength demultiplexer: using echelette gratings on silicon substrate," Applied Optics, vol. 24, No. 7, Apr. 1, 1985.

Rallison, R.D., "Dense Wavelength Division Multiplexing (DWDM) and the Dickson Grating," White Paper, Jan. 6, 2001.

M. Schilling et al., "Deformation–free overgrowth of reactive ion beam etched submicron structures in InP by liquid phase epitaxy," Appl. Phys. Lett. 49 (12), Sep. 22, 1986.

Z.J. Sun et al., Demultiplexer with 120 channels and 0.29–nm Channel Spacing, IEEE Photonics Technology Letters, vol. 10, No. 1, Jan. 1998.

W. Tang, et al., "Electrostatically Balanced Comb Drive for Controlled Levitation," Reprinted from Technical Digest IEEE Solid–State Sensor and Actuator Workshop, Jun. 1990; pp. 198–202.

L. Torcheux et al., "Electrochemical Coupling Effects on the Corrosion of Silicon Samples in HF Solutions," J. Electrochem.Soc., vol. 142, No. 6, Jun. 1995.

P. VanKessel et al., "A MEMS–Based Projection Display," Proceedings of the IEEE, vol. 86, No. 8, Aug. 1998; pp. 1687–1704.

Microfabricated Silicon High Aspect Ratio Flexures for In–Plane Motion; dissertation by C. Keller, Fall 1998.

Gimballed Electrostatic Microactuators with Embedded Interconnects; dissertation by L. Muller; Spring 2000.

\* cited by examiner

MOVABLE MICROSTRUCTURE WITH CONTACTLESS STOPS

CROSS-REFERENCES TO RELATED APPLICATIONS

This application is a continuation of U.S. patent application Ser. No. 10/705,390 entitled "BISTABLE MIRROR WITH CONTACTLESS STOPS," filed Nov. 10, 2003, U.S. Pat. No. 6,778,304, which is a divisional of U.S. patent application Ser. No. 09/899,004, entitled "BISTABLE MIRROR WITH CONTACTLESS STOPS," filed Jul. 3, 2001, U.S. Pat. No. 6,657,759. This application is also related to the following U.S. Patents.: U.S. Pat. No. 6,701,037, entitled "MEMS-BASED NONCONTACTING FREE-SPACE OPTICAL SWITCH" by Bevan Staple and Richard Roth; U.S. Pat. No. 6,614,581, entitled "METHODS AND APPARATUS FOR PROVIDING A MULTI-STOP MICROMIRROR," filed Jul. 30, 2001 by David Paul Anderson, and U.S. Pat. No. 6,625,342, entitled "SYSTEMS AND METHODS FOR OVERCOMING STICTION USING A LEVER," filed Jul. 3, 2001 by Bevan Staple, David Paul Anderson and Lilac Muller; all of which are herein incorporated by reference in its entirety for all purposes.

BACKGROUND OF THE INVENTION

This application relates generally to microelectromechanical systems, and more particularly to MEMS devices and methods configured to avoid stiction.

In recent years, increasing emphasis has been made on the development of techniques for producing microscopic systems that may be tailored to have specifically desired electrical and/or mechanical properties. Such systems are generically described as microelectromechanical systems (MEMS) and are desirable because they may be constructed with considerable versatility despite their very small size. In a variety of applications, MEMS component structures may be fabricated to move in such a fashion that there is a risk of stiction between that component structure and some other aspect of the system. One such example of a MEMS component structure is a micromirror, which is generally configured to reflect light from at least two positions. Such micromirrors find numerous applications, including as parts of optical switches, display devices, and signal modulators, among others.

In many applications, such as may be used in fiber-optics applications, such MEMS-based devices may include hundreds or even thousands of micromirrors arranged as an array. Within such an array, each of the micromirrors should be accurately aligned with both a target and a source. Such alignment is generally complex and typically involves fixing the location of the MEMS device relative to a number of sources and targets. If any of the micromirrors is not positioned correctly in the alignment process and/or the MEMS device is moved from the aligned position, the MEMS device will not function properly.

In part to reduce the complexity of alignment, some MEMS devices provide for individual movement of each of the micromirrors. An example is provided in FIGS. 1A–1C illustrating a particular MEMS micromirror structure that may take three positions. Each micromirror includes a reflective surface 116 mounted on a micromirror structural film 112 that is connected by a structural linkage 108 to an underlying substrate 104. Movement of an individual micromirror is controlled by energizing actuators 124a and/or 124b disposed underneath the micromirror on opposite sides of the structural linkage 108. Hard stops 120a and 120b are provided to stop the action of the micromirror structural film 112. Energizing the actuator 124a on the left side of the structural linkage 108 causes the micromirror to tilt on the structural linkage 108 towards that side until one edge of the micromirror structural film 112 contacts the left hard stop 120a, as shown in FIG. 1A. Alternatively, the actuator 124b on the right side of the structural linkage 108 may be energized to cause the micromirror to tilt in the opposite direction, as shown in FIG. 1B. When both actuators are de-energized, as shown in FIG. 1C, the micromirror returns to a static position horizontal to the structural linkage 108. In this way, the micromirror may be moved to any of three positions. This ability to move the micromirror provides a degree of flexibility useful in aligning the MEMS device, although the alignment complexity remains significant. Sometimes hard stops 120a and 120b are not provided so that the micromirror structural film 112 is in direct contact with the substrate 104.

In certain applications, once the micromirror is moved to the proper position, it may remain in that position for ten years or more. Thus, for example, one side of an individual micromirror structural film may remain in contact with the hard stop or substrate for extended periods. Maintaining such contact increases the incidence of dormancy-related stiction. Such stiction results in the micromirror remaining in a tilted position even after the actuators are de-energized. Some theorize that stiction is a result of molecule and/or charge build up at the junction between the micromirror structural film and the hard stop or substrate. For example, it has been demonstrated that an accumulation of $H_2O$ molecules at the junction produces capillary forces that increase the incidence of stiction.

Thus, one solution to overcome stiction is to package the MEMS device in a hermetic or inert environment. Such an environment reduces the possibility of molecule accumulation at the junction. However, such packaging is costly and prone to failure where seals break or are not properly formed. Further, such packaging is incompatible with many types of MEMS devices. In addition, such packaging does not reduce stiction related to charge build up at the junction.

In "Ultrasonic Actuation for MEMS Dormancy-Related Stiction Reduction", Proceedings of SPIE Vol. 4180 (2000), which is herein incorporated by reference for all purposes, Ville Kaajakari et al. describe a system for overcoming both molecule and charge related stiction. The system operates by periodically vibrating an entire MEMS device to overcome stiction forces. While there is evidence that vibrating the entire MEMS device can overcome stiction at discrete locations within the device, such vibration causes temporary or even permanent misalignment of the device. Thus, freeing an individual micromirror often requires performance of a costly alignment procedure. Even where the device is not permanently misaligned by the vibration, it is temporarily dysfunctional while the vibration is occurring.

Thus, there exists a need in the art for systems and methods for overcoming stiction in MEMS devices without causing misalignment.

SUMMARY OF THE INVENTION

Embodiments of the invention are therefore directed to a microstructure for steering light that mitigates stiction. A substrate is provided on which a structural linkage is connected to support a structural film. The structural film includes a reflective coating. A hold electrode is connected with the substrate at a position laterally beyond an orthogonal projection of the structural film on the substrate. It is configured to hold the structural film electrostatically in a tilted position with respect to the substrate upon application of a potential difference between the structural film and the hold electrode. Because of its positioning with respect to the structural film, it is ensured that the structural film is not in contact with the substrate when the structural film is being held by the hold electrode.

In some embodiments, a snap-in electrode is also provided. The snap-in electrode is connected with the substrate at a position laterally within the orthogonal projection of the structural film on the substrate. It is configured to tilt an end of the structural film in a direction towards the snap-in electrode upon application of a potential difference between the structural film and the snap-in electrode.

The hold electrode may be configured as a comb structure having a plurality of teeth. With such a configuration, a plurality of tilted positions for the structural film may be realized by the application of various potential differences between the structural film and the hold electrode. For example, it may be configured such that an increase in potential difference results in a hold position that deviates more strongly from horizontal.

The microstructure may be configured in different embodiments with a cantilever arrangement or with a torsion-beam arrangement. In embodiments that use the torsion-beam arrangement, a second hold electrode and/or second snap-in electrode may be provided on an opposite side of the structural linkage.

Embodiments of the invention are also directed to a method for fabricating a microstructure for steering light. A structural linkage is formed on a substrate. A structural film is formed on the structural linkage. A reflective coating is deposited on the structural film. A hold electrode is formed on the substrate at a position laterally beyond an orthogonal projection of the structural film on the substrate and configured to hold the structural film electrostatically in a tilted position with respect to the substrate upon application of a potential difference between the structural film and the hold electrode. A snap-in electrode may additionally be formed to tilt the end of the structural film towards the snap-in electrode upon application of a potential difference between the structural film and the snap-in electrode. The hold electrode may be fabricated as a comb structure to permit the selection of a plurality of tilted positions with variation in the potential difference applied. The microstructure may also be fabricated with cantilever or torsion-beam configurations. For embodiments fabricated according to torsion-beam configurations, additional hold and/or snap-in electrodes may be formed on the substrate opposite the structural linkage.

Further embodiments provide a method for operating an optical switch. A first end of a micromirror assembly is tilted towards a substrate by applying a first electrostatic force. Thereafter, the micromirror assembly is held in a first tilted position with respect to the substrate with a second electrostatic force originating from a point laterally beyond an orthogonal projection of the micromirror assembly on the substrate. In one embodiment, the micromirror assembly is released from the first tilted position. Thereafter, a second end of the micromirror assembly is tilted towards the substrate by applying a third electrostatic force. Thereafter, the micromirror assembly is held in a second tilted position with respect to the substrate with a fourth electrostatic force that originates from a point laterally beyond the orthogonal projection of the micromirror assembly on the substrate. In a certain embodiment, the first tilted position is selected from a plurality of possible first tilted positions by establishing a potential difference between the micromirror assembly and a first electrode used to establish the second electrostatic force, and the second tilted position is selected from a plurality of possible second tilted positions by establishing a potential difference between the micromirror assembly and a second electrode used to establish the fourth electrostatic force.

In still other embodiments, a wavelength router is provided that incorporates a microstructure for steering light. The wavelength router is configured for receiving light having a plurality of spectral bands at an input port and for directing subsets of the spectral bands to a plurality of output ports. A free-space optical train is disposed between the input port and the output ports providing optical paths for routing the spectral bands. The optical train also includes a dispersive element disposed to intercept light traveling from the input port. A routing mechanism is provided having at least one dynamically configurable routing element to direct a given spectral band to different output ports. The dynamically configurable routing element includes a micromirror assembly connected with a substrate by a structural linkage. A hold electrode connected with the substrate at a position laterally beyond an orthogonal projection of the micromirror assembly on the substrate is configured to hold the micromirror assembly electrostatically in a first tilted position with respect to the substrate upon application of a potential difference between the micromirror assembly and the hold electrode.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and is enclosed in parentheses to denote one of multiple similar components. When reference is made to a reference numeral without specification to an existing sublabel, it is intended to refer to all such multiple similar components.

DESCRIPTION OF THE SPECIFIC EMBODIMENTS

1. Introduction

Figure 1A:
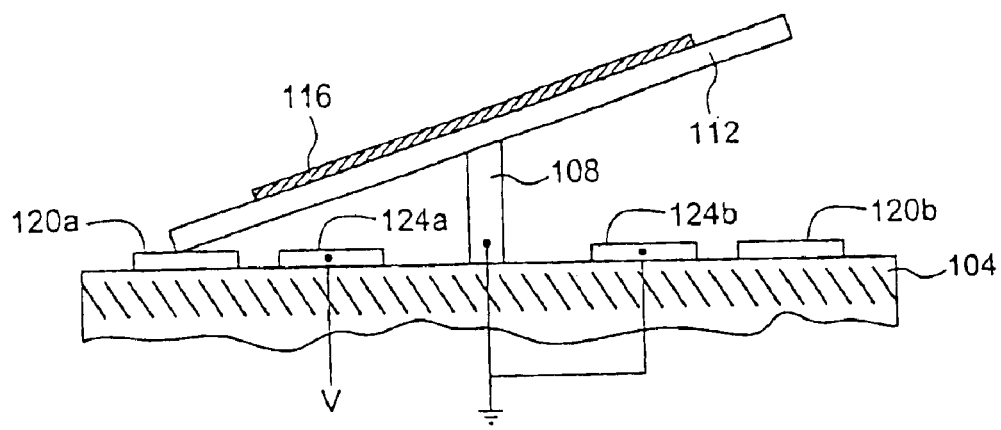
FIGS. 1A, 1B, and 1C are cross-sectional drawings of a tilting micromirror in three positions effected by actuation of different actuators.
Figure 1B:
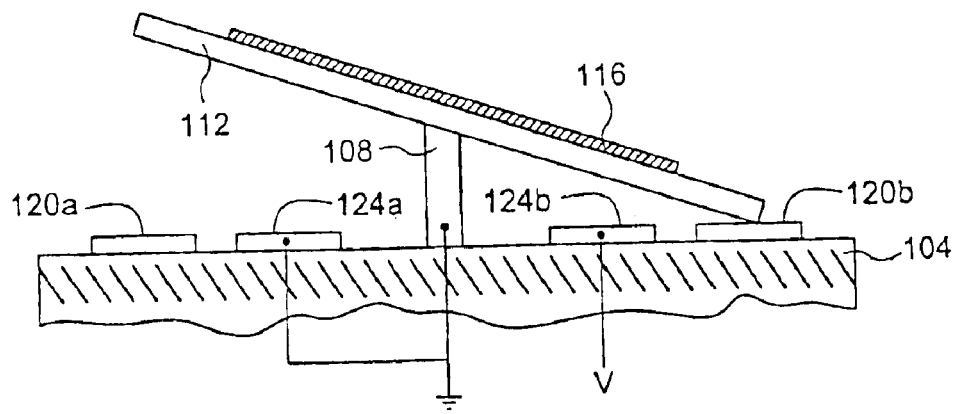
Figure 1C:
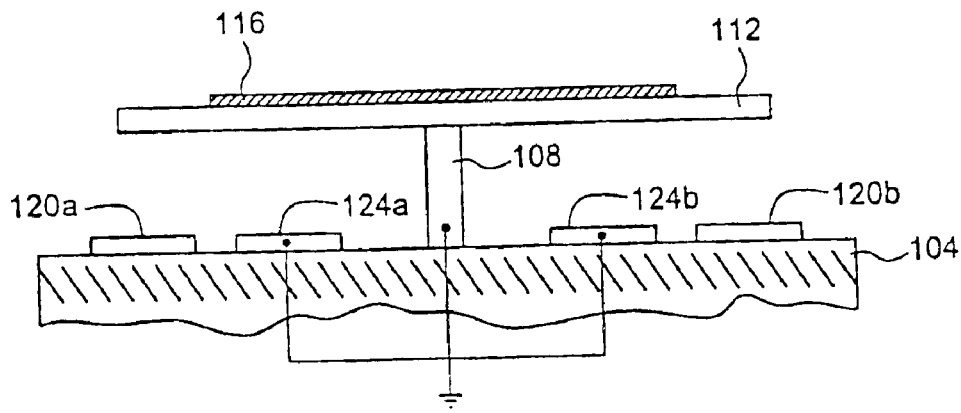

Embodiments of the invention are directed to MEMS methods and devices in which a microstructure is held in one of at least two possible stable positions without contacting either a substrate or hard stop. In certain embodiments, the microstructure is a micromirror that may be rotated to at least two such positions. Because of the ready applicability of such a rotating micromirror to optical-switch applications, some of the embodiments are directed to a wavelength router that uses optical switching. The stability of the microstructure positions is achieved without contact by employing electrostatic fields to hold the microstructure. Since there is no direct contact with the microstructure, stiction is thereby avoided. As will be clear to those of skill in the art from the following description, the invention may be adapted to different types of micromirror configurations, including cantilever micromirrors and torsion-beam micromirrors.

It is noted that throughout herein micromirror configurations are shown schematically in the figures for illustrative purposes. As will be understood by those of skill in the art, the point of rotation of the micromirror structural film should be selected so that in the desired static micromirror configurations both the forces on the structural film and the torques about the point of rotation cancel.

2. Torsion-beam Micromirror

One embodiment of the invention as applied to a torsion-beam micromirror configuration is illustrated in FIGS. 2A–2E. Each micromirror includes a reflective surface 216 mounted on a micromirror structural film 212 that is connected by at least one structural linkage 208 to an underlying substrate 204. In some embodiments, multiple structural linkages 208 are provided in the plane orthogonal to the page, the axis of rotation of the micromirror structural film 212 being defined by the alignment of the structural linkages. In one such embodiment, two structural linkages 208 are provided approximately on opposite sides of the micromirror along the axis of rotation. Two snap-in electrodes 224a and 224b and two hold electrodes 220a and 220b are provided on the substrate 204, with one of each type of electrode provided on either side of the structural linkage 208. The electrodes 220 and 224 and structural film 212 may be fabricated using standard MEMS techniques. Such MEMS techniques typically involve a combination of depositing structural material, such as polycrystalline silicon, depositing sacrificial material, such as silicon oxide, and dissolving the sacrificial material during a release step, for example with hydrofluoric acid (HF). It is thus sometimes convenient to identify the different structural layers in a MEMS microstructure as "poly-N" layers, where N denotes that a particular such layer was the Nth polysilicon layer deposited in a process that included multiple depositions. Often the first such layer is described as the "poly-0" layer.

The hold electrodes 220a and 220b are connected with the substrate 204 at a position laterally beyond an orthogonal projection of the structural film 212 onto the substrate 204. With such a configuration, the hold electrodes 220a and 220b are outside the region underneath the micromirror structural film 212. This geometry ensures that when the micromirror is in the hold positions shown in FIGS. 2C and 2E, the micromirror structural film 212 is not in contact with the substrate 204. In certain embodiments, the hold electrodes 220a and 220b have a greater height above the substrate 204 than the snap-in electrodes 224a and 224b. The electrodes may thus be fabricated with MEMS techniques in which a poly-0 layer is deposited to form the structure of the snap-in electrodes 224a and 224b and the lower part of the structure of the hold electrodes 222a and 222b. The remainder of the structure of the hold electrodes 221a and 221b may be fabricated with a subsequently deposited poly-1 layer. The micromirror structural film 212 is formed with a poly-3 layer. The reflective surface 216 is formed by depositing a layer of reflective metal, such as gold.

Figure 2A:
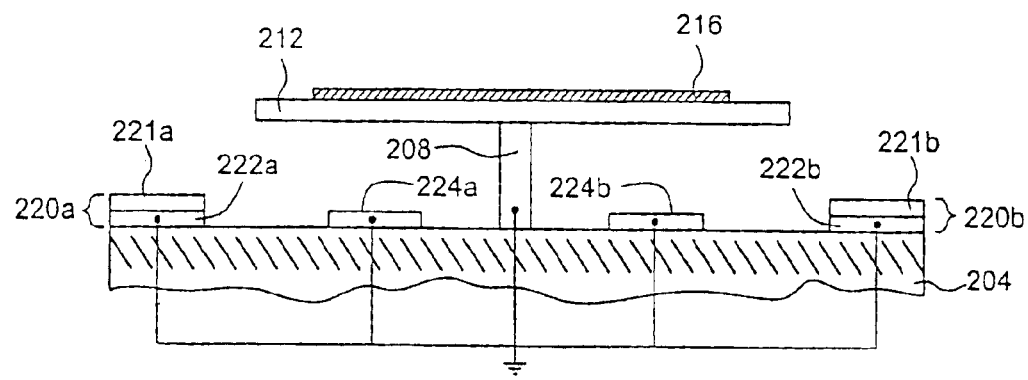
FIGS. 2A, 2B, 2C, 2D, and 2E are cross-sectional drawings of a torsion-beam micromirror configuration in accordance with the invention.

FIG. 2A shows the static horizontal configuration of the micromirror when all four of the electrodes 220a, 220b, 224a, and 224b are commonly grounded with the structural linkage 208. According to embodiments of the invention, the micromirror may be deflected to a position tilted to the right, as shown in FIG. 2C, or to a position tilted to the left, as shown in FIG. 2E. Either of these tilted positions is maintained through activation of the right or left hold electrode 220 as appropriate, such that the micromirror and structural film 212 have no contact with the substrate 204 or with a hard stop.

Figure 2B:
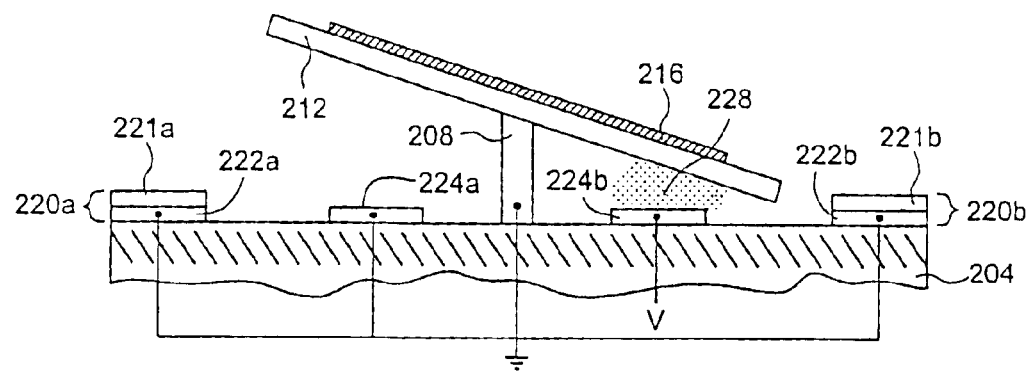
Figure 2C:
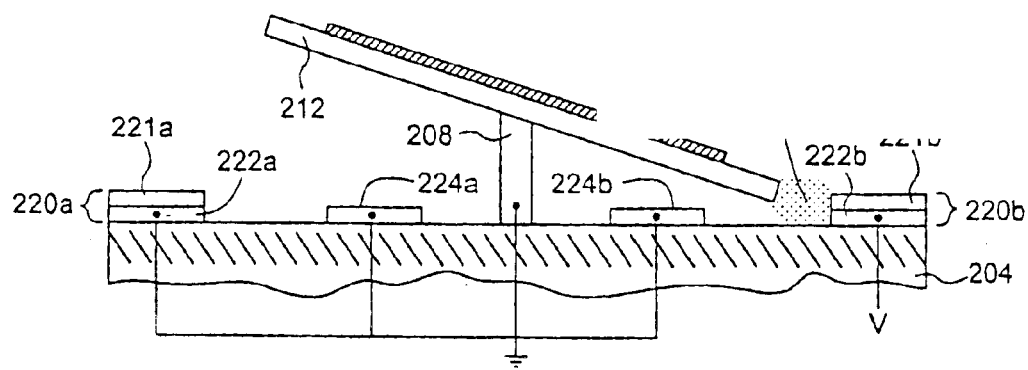

In order to achieve the right-tilted position, for example, the right snap-in electrode 224b is activated, as shown in FIG. 2B, by applying a voltage V to that electrode with respect to the common ground. The potential difference between the structural film 212 and the right snap-in electrode 224b thus creates an electric field with dotted field lines 228 shown. That right side of the structural film is thus deflected downwards such that the structural film 216 may come into contact with the substrate 204. Subsequently, the right hold electrode 220b is activated and the right snap-in electrode 224b is deactivated, creating an electric field between the structural film 212 and the right hold electrode 220b, shown by dotted electric field lines 232. This electric field thus maintains the micromirror in its tilted position without any contact with the substrate 204 or a hard stop, thereby avoiding stiction problems.

The micromirror may similarly be tilted to the left position shown in FIG. 2E. Activation of the left snap-in electrode 224a deflects the structural film 212 to the left, perhaps in contact with the substrate 204, with the electric field shown by dotted electric field lines 236. Subsequent deactivation of the left snap-in electrode 224a and activation of the left hold electrode 220a creates an electric field shown by dotted field lines 238 that acts to hold the micromirror in its left tilted position without contact with the substrate 204 or with a hard stop.

Figure 3:
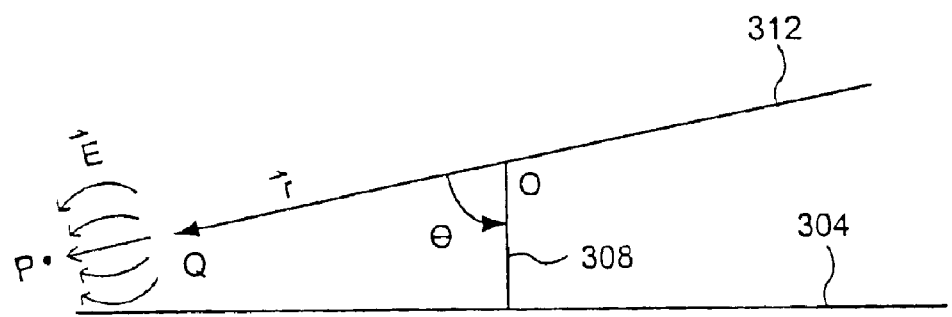
FIG. 3 is a schematic drawing defining a geometry of an electromechanical system defined by the torsion-beam micromirror assembly.
Figure 4:
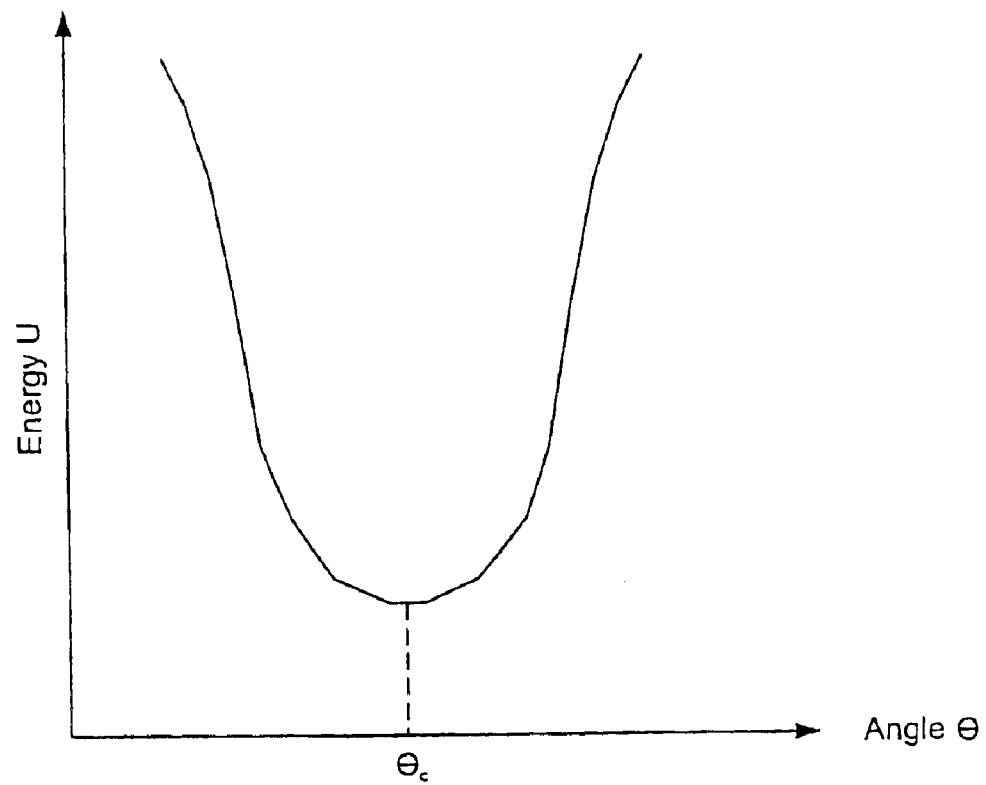
FIG. 4 is a graph illustrating the behavior of capacitive energy stored in one micromirror configuration in accordance with the invention.

The electromechanical behavior of the system may be better understood with reference to FIGS. 3 and 4. In FIG. 3, the geometry is shown for an arrangement in which a micromirror structural film 312 is held in a left-tilted position on a structural linkage 308 supported by a substrate 304. The structural linkage point O may be defined as an origin for the system with vectors r defining spatial positions, with angle θ defining the tilt. The electric field E that acts to hold the micromirror structural film 312 in position may be approximately represented with image charges P and Q. The potential difference created by activation of the hold electrode creates a capacitive arrangement defined by the micromirror structural film 312, the active electrode, and the gap between them. This capacitive arrangement has a capacitance $$C = \frac{2U}{V^2},$$

where U is the capacitive energy stored and V is the potential difference applied to the electrode. The capacitive energy may be defined in terms of the displacement and electric fields as $$U = \frac{1}{2}\int dr D(r) \cdot E(r).$$

The displacement field D(r) is related to the electric field E(r) according to the permittivity $\in(r)$ of the air in the gap, $$D(r) = \in E(r)$$

Figure 2D:
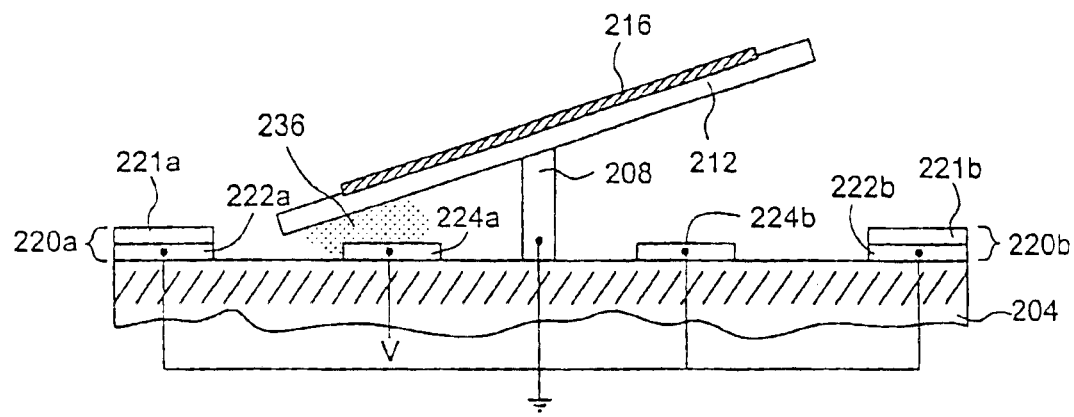
Figure 2E:
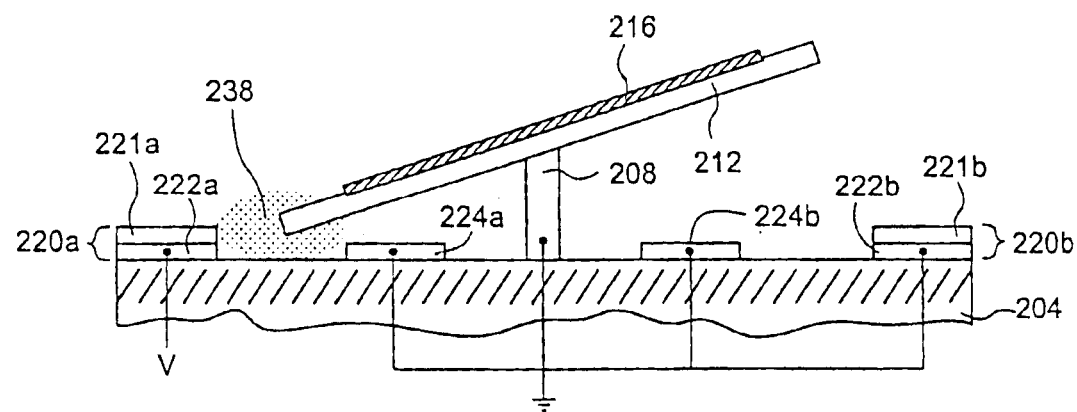

FIG. 4 illustrates the approximate dependence of the capacitive energy U as a function of the tilt angle θ. In orienting the micromirror structural film relative to the active holding electrode, the system will seek to minimize the energy U by selecting angle $\theta_0$. The fact that the system has a preferred tilt angle $\theta_0$ may alternatively be understood from the fact that the attractive electrostatic force is inversely proportional to the square of the separation between the electrode and the micromirror structural film; the system thus seeks to minimize that separation. In some embodiments, it is preferable to activate the hold electrode when the system is already oriented near $\theta_0$. This is achieved in such embodiments, as illustrated in FIGS. 2B and 2D, by using one of the snap-in electrodes to move the micromirror structural film such that $\theta \approx \theta_0$ before activation of the hold electrode.

3. Cantilever Micromirror

Figure 5A:
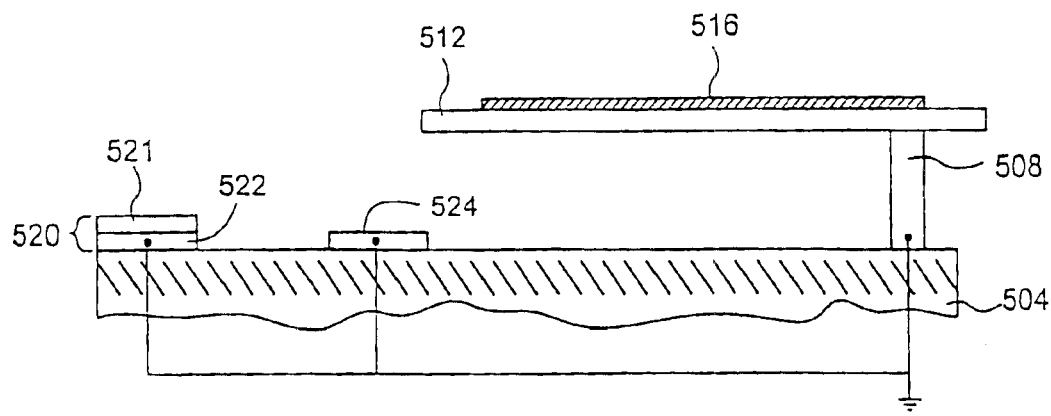
FIGS. 5A, 5B, and 5C are cross-sectional drawings of a cantilever micromirror configuration in accordance with the invention.
Figure 5B:
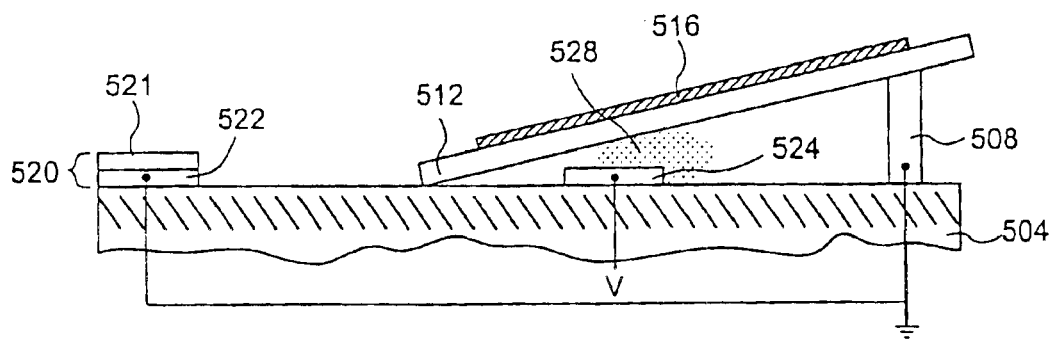
Figure 5C:
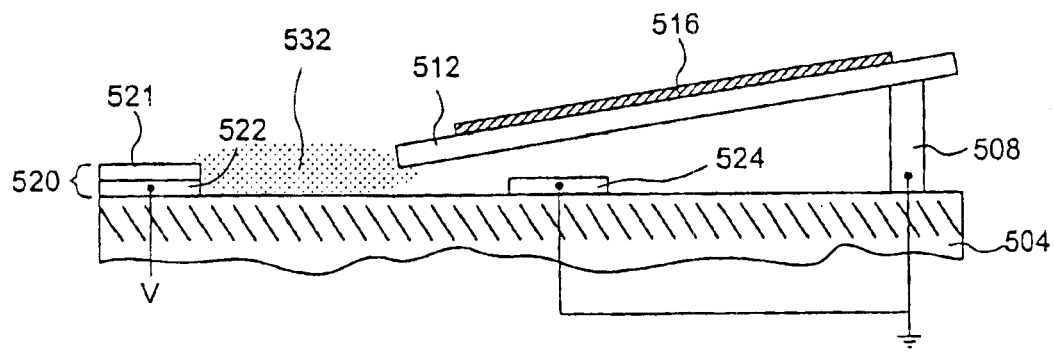

Embodiments of the invention may also be used with cantilever micromirror arrangements. Cantilever arrangements are similar to torsion-beam arrangements, but use a flexure positioned at one side of the micromirror. An example of a cantilever micromirror arrangement in accordance with the invention is illustrated in FIGS. 5A–5C. The cantilever arrangement generally permits a static horizontal position, as shown in FIG. 5A, and a tilted position, as shown in FIG. 5C. Like the torsion-beam arrangement, the tilted position of the cantilever arrangement is maintained without contacting either the substrate 504 or a hard stop.

Each micromirror includes a reflective surface 516 mounted on a micromirror structural film 512 that is connected by at least one flexure 508 to an underlying substrate 504. A snap-in electrode 524 and a hold electrode 520 are provided. The hold electrode 520 may be composed of a poly-0 layer 522 and a poly-1 layer 521. When the snap-in electrode 520 and hold electrode 525 are both commonly grounded with the flexure 508, as shown in FIG. 5A, the micromirror is in the horizontal position. The tilted position may be reached by activating the snap-in electrode 524 to produce the electric field shown with electric field lines 528 in FIG. 5B, and thereby move the micromirror structural film 512 downwards, such that it may come in contact with the substrate. Subsequent deactivation of the snap-in electrode 524 and activation of the hold electrode 520 causes the electric field shown with electric field lines 532 in FIG. 5C to hold the micromirror structural film 512 in its tilted position in a contactless fashion. As for the torsion-beam configuration, the hold electrode 520 is connected with the substrate 504 at a position laterally beyond an orthogonal projection of the structural film 12 onto the substrate 504. With such a configuration, the hold electrode 520 is outside the region underneath the micromirror structural film 512. This geometry ensures that when the micromirror is in the hold position shown in FIGS. 5C, the micromirror structural film 512 is not in contact with the substrate 504.

4. Multistable Micromirror Configurations

Figure 6A:
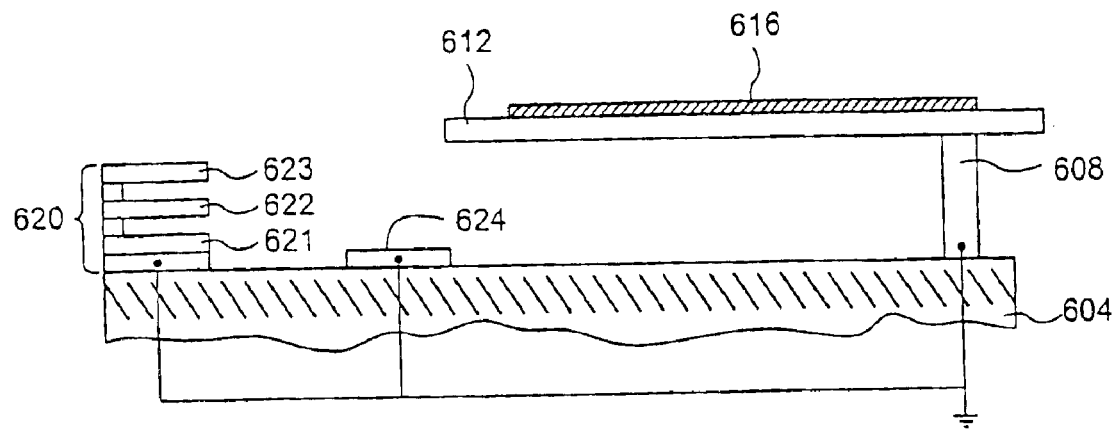
FIGS. 6A, 6B, 6C, and 6D are cross-sectional drawings of a multistable micromirror configuration in accordance with the invention.
Figure 6B:
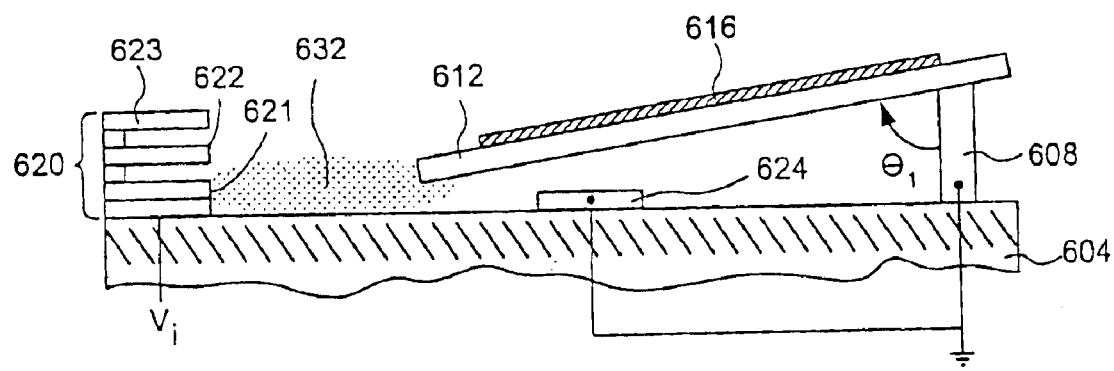
Figure 6C:
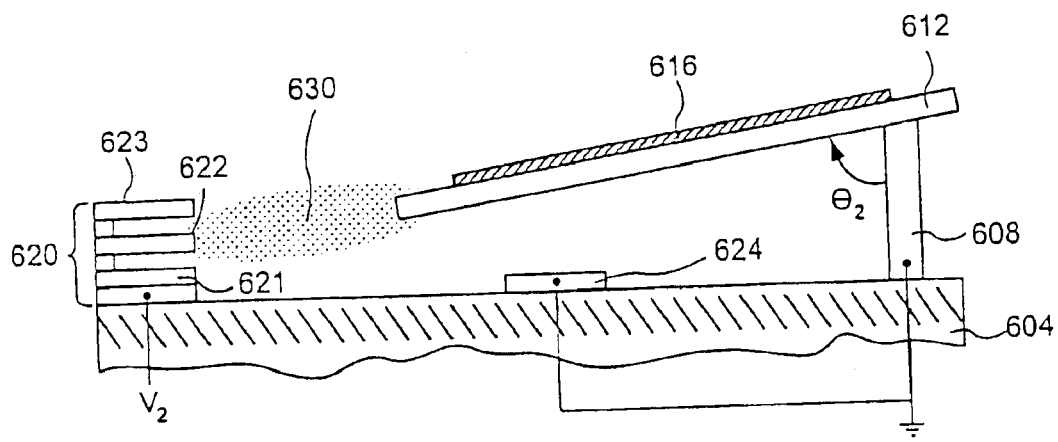
Figure 6D:
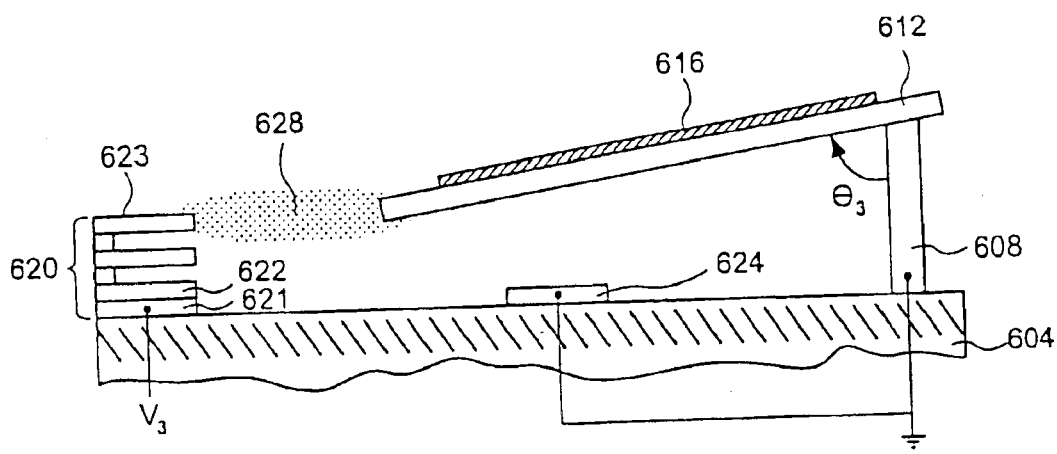

FIGS. 6A–6D illustrates an embodiment of the invention in which multistable micromirror configurations are realized. The illustration in FIGS. 6A–6D is shown for a cantilever-type micromirror assembly, although it may be adapted to other micromirror configurations, including torsion-beam configurations. In FIGS. 6A–6D, a reflective surface 616 is mounted on a micromirror structural film 612 connected to underlying substrate 604 by at least one flexure 608. A snap-in electrode 624 may be provided such that the creation of a potential difference between it and the micromirror structural film 612 may be used to tilt the micromirror, perhaps in contact with the substrate 604 as described with respect to FIG. 5B. The hold electrode 620 is configured as a comb structure with multiple teeth 621, 622, and 623. The teeth are configured at different heights above the substrate and may be used to achieve different tilt orientations of the micromirror. As in the previous embodiments, the hold electrode 620 is connected with the substrate 604 at a position laterally beyond an orthogonal projection of the structural film 612 onto the substrate 604. With such a configuration, the hold electrode 620 is outside the region underneath the micromirror structural film 612. Thus, as illustrated in FIGS. 6B–6D, the application of a potential difference between the hold electrode 620 and the micromirror structural film 612 results in an electric field that holds the micromirror in a tilted position without contact with the substrate 604 or a hard stop.

Figure 6E:
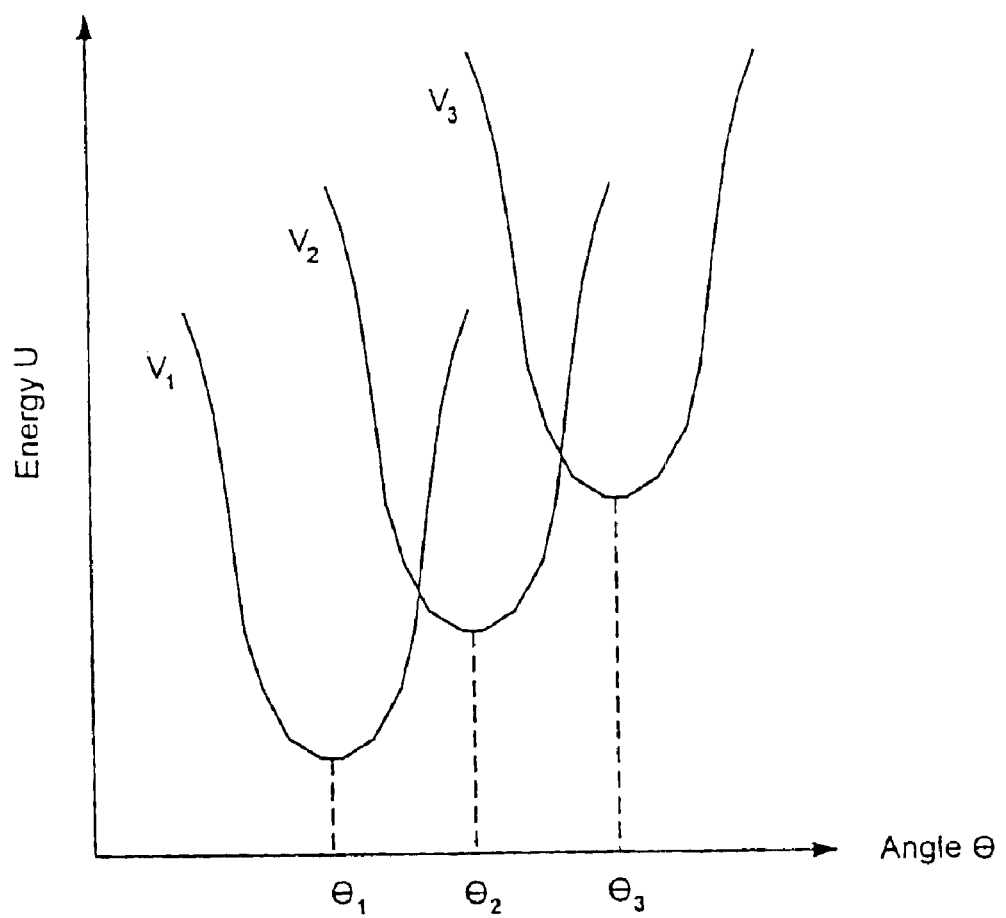
FIG. 6E is a graph illustrating the behavior of capacitive energy stored in a multistable micromirror configuration.

The degree of tilt is dependent on the size of the potential difference, as may be understood with further reference to FIG. 6E. For example, when a potential difference $V_1$ is applied, as shown in FIG. 6B, a capacitive system is formed between the micromirror structural film 612 and the hold electrode 620. The resulting electric field is shown with field lines 628 and the energy behavior U as a function of tilt angle θ is shown in FIG. 6E. The general behavior of U as a function of θ is similar to that described with respect to FIG. 4, with the system seeking the energy minimum, and thereby being held at tilt angle $\theta = \theta_1$. For a smaller potential difference $V_2 < V_1$, the energy behavior U has the same qualitative behavior, but has a shallower minimum located at a higher tilt angle, as shown in FIGS. 6C and 6E. Thus, upon application of potential difference $V_2$, the system seeks a hold position at tilt angle $\theta = \theta_2$, with the electric field shown by field lines 630. Similarly, a still smaller potential difference $V_3 < V_2$ results in an energy curve in FIG. 6E having a still shallower minimum at a still higher angle. Accordingly, the system seeks a hold position at tilt angle $\theta = \theta_3$ with electric field lines 632, as shown in FIG. 6D. The snap-in electrode 624 is useful for achieving an initial tilt for the micromirror structural film 612.

5. Fiber-Optics Applications a. Wavelength Router

Tilting micromirrors according to the embodiments described above, and their equivalents, may be used in numerous applications as parts of optical switches, display devices, or signal modulators, among others. One particular application of such tilting micromirrors is as optical switches in a wavelength router such as may be used in fiber-optic telecommunications systems. One such wavelength router is described in detail in U.S. Pat. No. 6,501,877, entitled "Wavelength Router," which is herein incorporated by reference in its entirety, including the Appendix, for all purposes. The various micromirror embodiments may be used in that wavelength router or may be incorporated into other wavelength routers as optical switches where it is desirable to avoid stiction problems.

Fiber optic telecommunications systems are currently deploying a relatively new technology called dense wavelength division multiplexing (DWDM) to expand the capacity of new and existing optical fiber systems to help satisfy the steadily increasing global demand for bandwidth. In DWDM, multiple wavelengths of light simultaneously transport information through a single optical fiber. Each wavelength operates as an individual channel carrying a stream of data. The carrying capacity or a fiber is multiplied by the number of DWDM channels used. Today DWDM systems employing up to 80 channels are available from multiple manufacturers, with more promised in the future.

In all telecommunication networks, there is the need to connect individual channels (or circuits) to individual destination points, such as an end customer or to another network. Systems that perform these functions are called cross-connects. Additionally, there is the need to add or drop particular channels at an intermediate point. Systems that perform these functions are called add-drop multiplexers (ADMs). All of these networking functions are performed with a wavelength router used with the current invention by an all-optical network. Optical networks designed to operate at the wavelength level are commonly called "wavelength routing networks" or "optical transport networks" (OTN). In a wavelength routing network, the individual wavelengths in a DWDM fiber must be manageable. New types of photonic network elements operating at the wavelength level are required to perform the cross-connect, ADM and other network switching functions. Two of the primary functions are optical add-drop multiplexers (OADM) and wavelength-selective cross-connects (WSXC).

Wavelength routing functions may be performed optically with a free-space optical train disposed between the input ports and the output ports, and a routing mechanism. The free-space optical train can include air-spaced elements or can be of generally monolithic construction. The optical train includes a dispersive element such as a diffraction grating, and is configured so that the light from the input port encounters the dispersive element twice before reaching any of the output ports. The routing mechanism includes one or more routing elements and cooperates with the other elements in the optical train to provide optical paths that couple desired subsets of the spectral bands to desired output ports. The routing elements are disposed to intercept the different spectral bands after they have been spatially separated by their first encounter with the dispersive element.

Figure 7A:
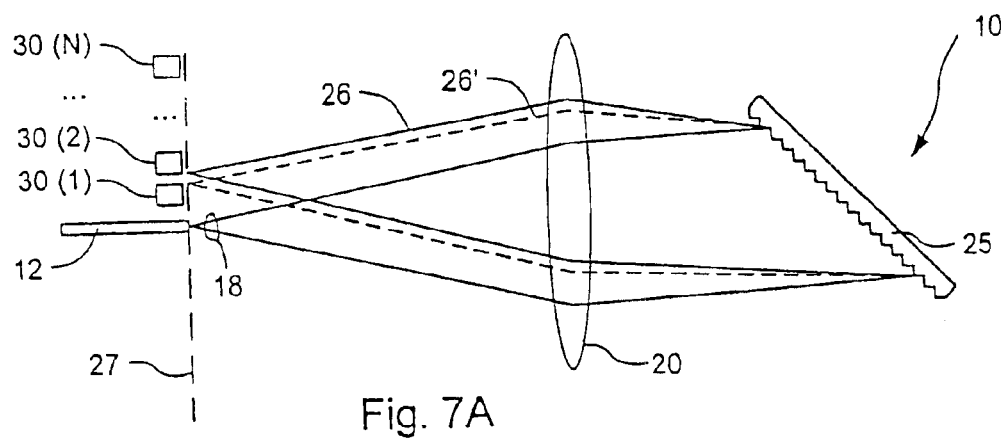
FIGS. 7A, 7B, and 7C are schematic top, side, and end views, respectively, of one embodiment of a wavelength router that uses spherical focusing elements.
Figure 7B:
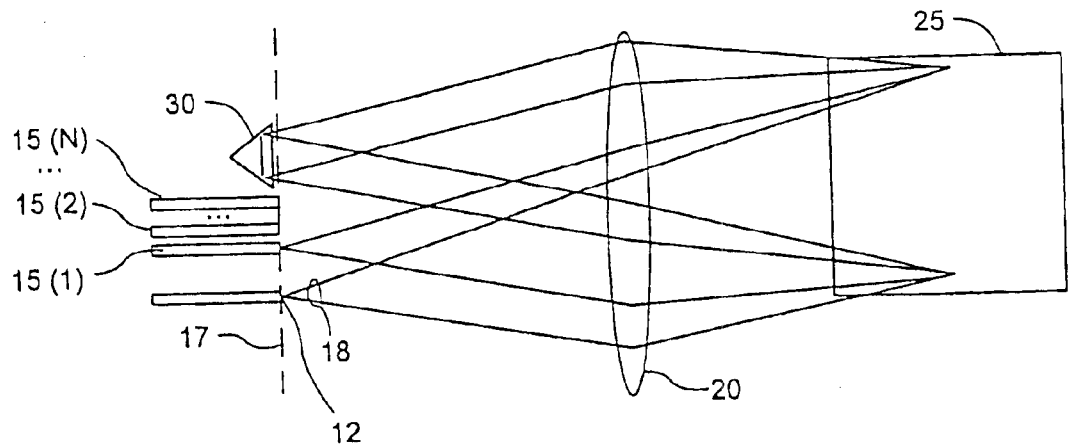
Figure 7C:
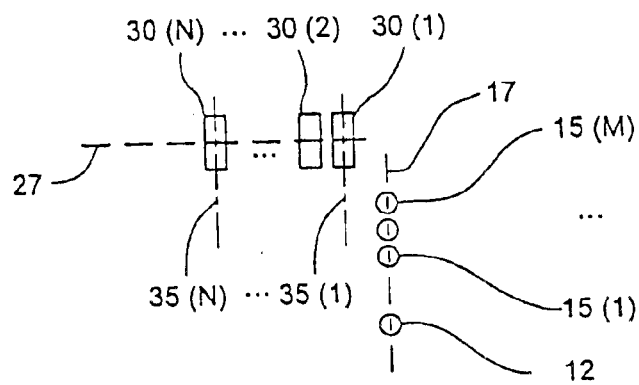

FIGS. 7A, 7B, and 7C are schematic top, side, and end views, respectively, of one embodiment of a wavelength router 10. Its general functionality is to accept tight having a plurality N of spectral bands at an input port 12, and to direct subsets of the spectral bands to desired ones of a plurality M of output ports, designated 15(1) . . . 15(M). The output ports are shown in the end view of FIG. 7C as disposed along a line 17 that extends generally perpendicular to the top view of FIG. 7A. Light entering the wavelength router 10 from input port 12 forms a diverting beam 18, which includes the different spectral bands. Beam 18 encounters a lens 20 that collimates the light and directs it to a reflective diffraction grating 25. The grating 25 disperses the light so that collimated beams at different wavelengths are directed at different angles back towards the lens 20.

Two such beams are shown explicitly and denoted 26 and 26', the latter drawn in dashed lines. Since these collimated beams encounter the lens 20 at different angles, they are focused towards different points along a line 27 in a transverse plane extending in the plane of the top view of FIG. 7A. The focused beams encounter respective ones of a plurality of retroreflectors that may be configured according as contactless micromirror optical switches as described above, designated 30(1) . . . 30(N), located near the transverse plane. The beams are directed back, as diverging beams, to the lens 20 where they are collimated, and directed again to the grating 25. On the second encounter with the grating 25, the angular separation between the different beams is removed and they are directed back to the lens 20, which focuses them. The retroreflectors 30 may be configured to send their intercepted beams along a reverse path displaced along respective lines 35(1) . . . 35(N) that extend generally parallel to line 17 in the plane of the side view of FIG. 7B and the end view of FIG. 2C, thereby directing each beam to one or another of output ports 15.

Figure 8A:
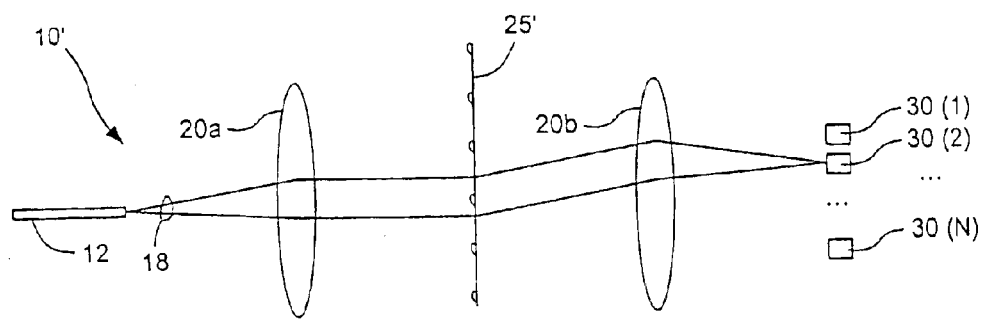
FIGS. 8A and 8B are schematic top and side views, respectively, of a second embodiment of a wavelength router that uses spherical focusing elements.
Figure 8B:
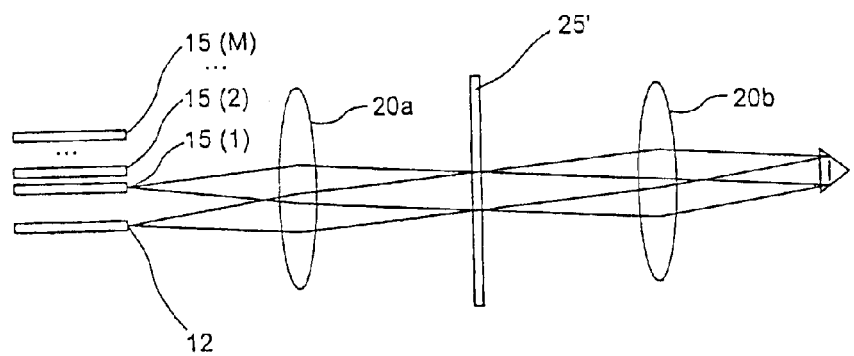

Another embodiment of a wavelength router, designated 10', is illustrated with schematic top and side views in FIGS. 8A and 8B, respectively. This embodiment may be considered an unfolded version of the embodiment of FIGS. 7A–7C. Light entering the wavelength router 10' from input port 12 forms diverging beam 18, which includes the different spectral bands. Beam 18 encounters a first lens 20a, which collimates the light and directs it to a transmissive grating 25'. The grating 25' disperses the light so that collimated beams at different wavelengths encounter a second lens 20b, which focuses the beams. The focused beams are reflected by respective ones of plurality of retroreflectors 30, which may also be configured as contactless micromirror optical switches, as diverging beams, back to lens 20b, which collimates them and directs them to grating 25'. On the second encounter, the grating 25' removes the angular separation between the different beams, which are then focused in the plane of output ports 15 by lens 20a.

Figure 9:
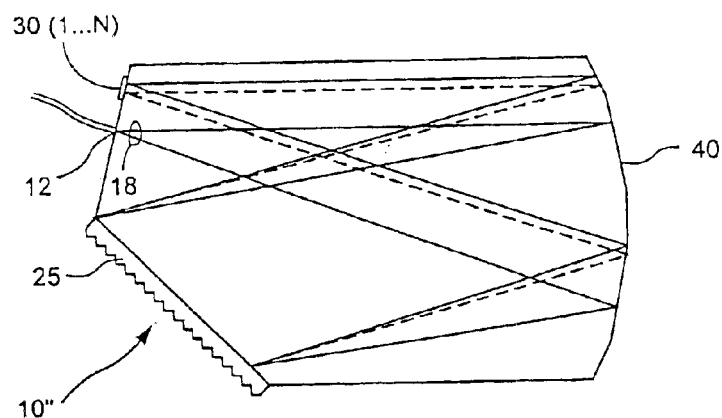
FIG. 9 is a schematic, top view of a third embodiment of a wavelength router that uses spherical focusing elements.

A third embodiment of a wavelength router, designated 10", is illustrated with the schematic top view shown in FIG. 9. This embodiment is a further folded version of the embodiment of FIGS. 7A–7C, shown as a solid glass embodiment that uses a concave reflector 40 in place of lens 20 of FIGS. 7A–7C or lenses 20a and 20b of FIGS. 8A–8B. Light entering the wavelength router 10" from input port 12 forms diverging beam 13, which includes the different spectral bands. Beam 18 encounters concave reflector 40, which collimates the light and directs it to reflective diffraction grating 25, where it is dispersed so that collimated beams at different wavelengths are directed at different angles back towards concave reflector 40. Two such beams are shown explicitly, one in solid lines and one in dashed lines. The beams then encounter retroreflectors 30 and proceed on a return path, encountering concave reflector 40, reflective grating 25', and concave reflector 40, the final encounter with which focuses the beams to the desired output ports. Again, the retroreflectors 30 may be configured as contactless micromirror optical switches.

b. Contactless-Micromirror Optical-Switch Retroreflector Implementations

Figure 10A:
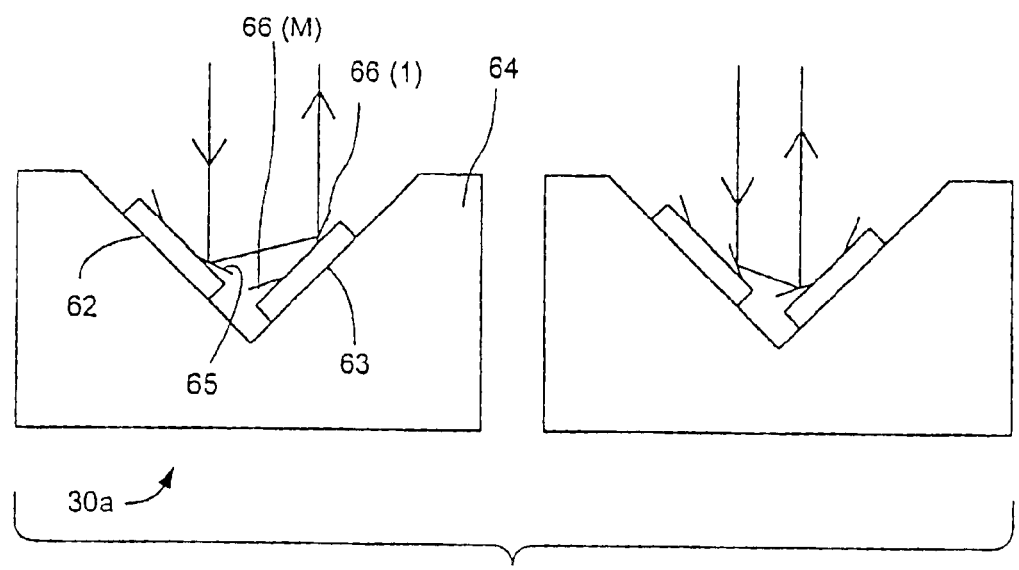
FIGS. 10A and 10B are side and top views of an implementation of a micromirror retroreflector array.
Figure 10B:
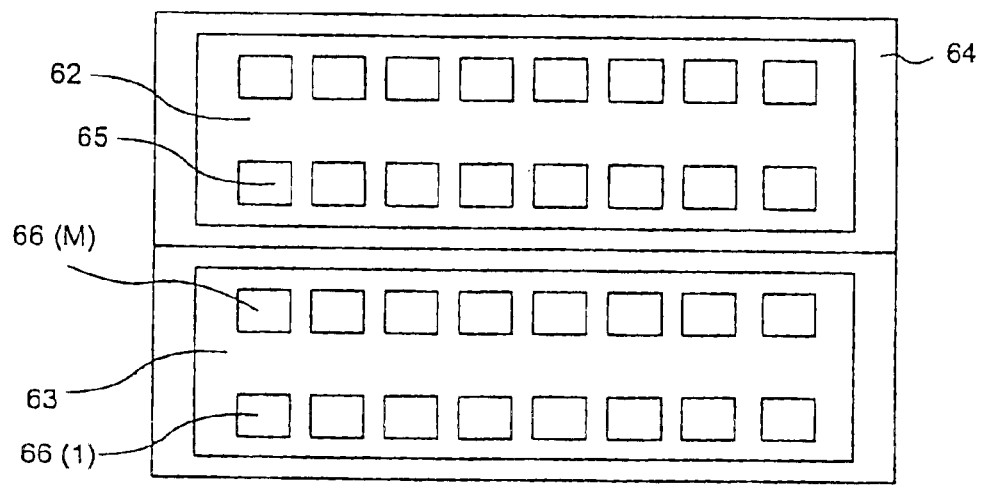

FIG. 10A shows schematically the operation of a retroreflector, designated 30a, that uses contactless-micromirror optical switches. FIG. 10B is a top view. A pair of micromirror arrays 62 and 63 is mounted to the sloped faces of a V-block 64. A single micromirror 65 in micromirror array 62 and a row of micromirrors 66(1 . . . M) in micromirror array 63 define a single retroreflector. Micromirror arrays may conveniently be referred to as the input and output micromirror arrays, with the understanding that light paths are reversible. The left portion of the figure shows micromirror 65 in a first orientation so as to direct the incoming beam to micromirror 66(1), which is oriented 90° with respect to micromirror 65's first orientation to direct the beam back in a direction opposite to the incident direction. The right half of the figure shows micromirror 65 in a second orientation so as to direct the incident beam to micromirror 66(M). Thus, micromirror 65 is moved to select the output position of the beam, while micromirrors 66(1 . . . M) are fixed during normal operation. Micromirror 65 and the row of micromirrors 66(1 . . . M) can be replicated and displaced in a direction perpendicular to the plane of the figure. While micromirror array 62 need only be one-dimensional, it may be convenient to provide additional micromirrors to provide additional flexibility.

In one embodiment, the micromirror arrays are planar and the V-groove has a dihedral angle of approximately 90° so that the two micromirror arrays face each other at 90°. This angle may be varied for a variety of purposes by a considerable amount, but an angle of 90° facilitates routing the incident beam with relatively small angular displacements of the micromirrors. In certain embodiments, the input micromirror array has at least as many rows of micromirrors as there are input ports (if there are more than one), and as many columns of mirrors as there are wavelengths that are to be selectably directed toward the output micromirror array. Similarly, in some embodiments, the output micromirror array has at least as many rows of micromirrors as there are output ports, and as many columns of mirrors as there are wavelengths that are to be selectably directed to the output ports.

In a system with a magnification factor of one-to-one, the rows of micromirrors in the input array are parallel to each other and the component of the spacing from each other along an axis transverse to the incident beam corresponds to the spacing of the input ports. Similarly, the rows of micromirrors in the output array are parallel to each other and spaced from each other (transversely) by a spacing corresponding to that between the output ports. In a system with a different magnification, the spacing between the rows of mirrors would be adjusted accordingly.

Having described several embodiments, it will be recognized by those of skill in the art that various modifications, alternative constructions, and equivalents may be used without departing from the spirit of the invention. Accordingly, the above description should not be taken as limiting the scope of the invention, which is defined in the following claims.

What is claimed is:

1. A microstructure comprising:
   a substrate;
   a structural linkage connected with the substrate and supporting a structural film; and
   a first hold electrode connected with the substrate at a position laterally beyond an orthogonal projection of the structural film on the substrate and configured to hold the structural film electrostatically in a first tilted position with respect to the substrate upon application of a potential difference between the structural film and the first hold electrode.

2. The microstructure recited in claim 1 further comprising a first snap-in electrode connected with the substrate at a position laterally within the orthogonal projection of the structural film on the substrate and configured to tilt an end of the structural film in a direction towards the first snap-in electrode upon application of a potential difference between the structural film and the first snap-in electrode.

3. The microstructure recited in claim 2 wherein the first snap-in electrode comprises a polysilicon layer.

4. The microstructure recited in claim 3 wherein the first hold electrode comprises a polysilicon bilayer.

5. The microstructure recited in claim 1 wherein the first hold electrode comprises a comb structure having a plurality of teeth, the first hold electrode being configured such that the first tilted position is defined by an angle with respect to the substrate that depends on the potential difference between the structural film and the first hold electrode.

6. The microstructure recited in claim 5 wherein the angle of the first tilted position deviates increasingly from horizontal with an increase in the potential difference between the structural film and the first electrode.

7. The microstructure recited in claim 1 further comprising a second hold electrode connected with the substrate at a position laterally beyond an orthogonal projection of the structural film and the substrate and on an opposite side of the structural linkage from the first hold electrode, wherein the second hold electrode is configured to hold the structural film electrostatically in a second tilted position with respect to the substrate upon application of a potential difference between the structural film and the second hold electrode.

8. The microstructure recited in claim 7 further comprising first and second snap-in electrodes connected with the substrate at positions laterally within the orthogonal projection of the structural film on the substrate and on opposite sides of the structural linkage, each of the first and second snap-in electrodes being configured to tilt an end of the structural film in a direction towards that snap-in electrode upon application of a potential difference between the structural film and that snap-in electrode.

9. The microstructure recited in claim 8 wherein the first and second snap-in electrodes comprise a polysilicon layer.

10. The microstructure recited in claim 9 wherein the first and second hold electrodes comprise a polysilicon bilayer.

11. The microstructure recited in claim 7,
   wherein the first hold electrode comprises a first comb structure having a plurality of teeth, the first hold electrode being configured such that the first tilted position is defined by a first angle with respect to the substrate that depends on the potential difference between the structural film and the first electrode; and
   wherein the second hold electrode comprises a second comb structure having a plurality of teeth, the second hold electrode being configured such that the second tilted position is defined by a second angle with respect to the substrate that depends on the potential difference between the structural film and the second electrode.

12. The microstructure recited in claim 11,
   wherein the first angle deviates increasingly from horizontal with an increase in the potential difference between the structural film and the first electrode; and
   wherein the second angle deviates increasingly from horizontal with an increase in the potential difference between the structural film and the second electrode.

13. A method for fabricating a microstructure, the method comprising:
   forming a first hold electrode on a substrate;
   forming a structural linkage on the substrate; and
   forming a structural film on the structural linkage;

wherein the first hold electrode is at a position laterally beyond an orthogonal projection of the structural film on the substrate and configured to hold the structural film electrostatically in a first tilted position with respect to the substrate upon application of a potential difference between the structural film and the first hold electrode.

14. The method recited in claim 13 further comprising forming a first snap-in electrode on the substrate at a position laterally within the orthogonal projection of the structural film and the substrate and configured to tilt an end of the structural film in a direction towards the first snap-in electrode upon application of a potential difference between the structural film and the first snap-in electrode.

15. The method recited in claim 13 wherein forming a first hold electrode comprises forming a comb structure having a plurality of teeth, wherein the first hold electrode is configured such that the first tilted position is defined by an angle with respect to the substrate that depends on the potential difference between the structural film and the first hold electrode.

16. The method recited in claim 13 further comprising forming a second hold electrode on the substrate at a position laterally beyond an orthogonal projection of the structural film on the substrate and on an opposite side of the structural linkage from the first hold electrode, wherein the second hold electrode is configured to hold the structural film electrostatically in a second tilted position with respect to the substrate upon application of a potential difference between the structural film and the second hold electrode.

17. The method recited in claim 16 further comprising forming first and second snap-in electrodes on the substrate at positions laterally within the orthogonal projection of the structural film on the substrate and on opposite sides of the structural linkage, each of the first and second snap-in electrodes being configured to tilt an end of the structural film in a direction towards that snap-in electrode upon application of a potential difference between the structural film and that snap-in electrode.

18. The method recited in claim 16 wherein,
forming a first hold electrode comprises forming a first comb structure having a plurality of teeth, wherein the first hold electrode is configured such that the first tilted position is defined by an angle with respect to the substrate that depends on the potential difference between the structural film and the first hold electrode; and
forming a second hold electrode comprises forming a second comb structure having a plurality of teeth, wherein the second hold electrode is configured such that the second tilted position is defined by an angle with respect to the substrate that depends on the potential difference between the structural film and the second hold electrode.

19. A method for operating a microstructure having a structural film formed above a substrate, the method comprising:
tilting a first end of the structural film towards a substrate by applying a first electrostatic force; and
thereafter, holding the structural film in a first tilted position with respect to the substrate with a second electrostatic force originating from a point laterally beyond an orthogonal projection of the structural film on the substrate.

20. The method recited in claim 19 further comprising:
releasing the structural film from the first tilted position;
thereafter, tilting a second end of the structural film towards the substrate by applying a third electrostatic force; and
thereafter, holding the structural film in a second tilted position with respect to the substrate with a fourth electrostatic force originating from a point laterally beyond the orthogonal projection of the structural film on the substrate.

21. The method recited in claim 20 further comprising:
selecting the first tilted position from a plurality of possible first tilted positions by establishing a potential difference between the structural film and a first electrode used to establish the second electrostatic force; and
selecting the second tilted position from a plurality of possible second tilted positions by establishing a potential difference between the structural film and a second electrode used to establish the fourth electrostatic force.

22. The method recited in claim 19 further comprising selecting the first tilted position from a plurality of possible first tilted positions by establishing a potential difference between the structural film and a first electrode used to establish the second electrostatic force.

23. A microstructure comprising:
support means;
tiltable structural means connected with the support means; and
first electrostatic-field-generation means for providing an electrostatic field to hold the tiltable structural means in a tilted position with respect to the support means, wherein the first electrostatic-field-generation means is connected with the support means at a position laterally beyond an orthogonal projection of the tiltable structural means on the support means.

24. The microstructure recited in claim 23 further comprising second electrostatic-force-generation means for tilting the tiltable structural means, wherein the second electrostatic-field-generation means is connected with the support means at a position laterally within the orthogonal projection of the tiltable structural means on the support means.

25. The microstructure recited in claim 23 wherein the first electrostatic-force-generation means is configured for providing a plurality of electrostatic fields to hold the tiltable structural means in a respective plurality of tilted positions depending on a state of the first electrostatic-force-generation means.

26. The microstructure recited in claim 23 wherein the tiltable structural means comprises torsion-beam means.

27. The microstructure recited in claim 23 wherein the tiltable structural means comprises cantilever means.

* * * * *